United States Patent
Falk

(10) Patent No.: US 12,191,589 B2
(45) Date of Patent: Jan. 7, 2025

(54) SOLDER COATED RIVET ELECTRICAL CONNECTOR

(71) Applicant: Aptiv Technologies AG, Schaffhausen (CH)

(72) Inventor: William Falk, Warwick, RI (US)

(73) Assignee: APTIV TECHNOLOGIES AG, Schaffhausen (CH)

(*) Notice: Subject to any disclaimer, the term of this patent is extended or adjusted under 35 U.S.C. 154(b) by 385 days.

(21) Appl. No.: 17/243,944

(22) Filed: Apr. 29, 2021

(65) Prior Publication Data

US 2022/0013939 A1    Jan. 13, 2022

Related U.S. Application Data

(60) Provisional application No. 63/049,910, filed on Jul. 9, 2020.

(51) Int. Cl.
| | |
|---|---|
| *H01R 4/06* | (2006.01) |
| *H01R 12/69* | (2011.01) |
| *H01R 43/048* | (2006.01) |
| *H01R 43/16* | (2006.01) |
| *H01R 43/20* | (2006.01) |
| *H01R 43/24* | (2006.01) |
| *B23K 35/26* | (2006.01) |
| *B23K 101/36* | (2006.01) |
| *B23K 103/12* | (2006.01) |

(52) U.S. Cl.
CPC .............. *H01R 12/69* (2013.01); *H01R 4/06* (2013.01); *H01R 43/048* (2013.01); *H01R 43/16* (2013.01); *H01R 43/205* (2013.01); *H01R 43/24* (2013.01); *B23K 35/26* (2013.01); *B23K 2101/36* (2018.08); *B23K 2103/12* (2018.08)

(58) Field of Classification Search
CPC .......... H01R 4/06; H01R 9/20; H01R 13/115; H01R 13/245
See application file for complete search history.

(56) References Cited

U.S. PATENT DOCUMENTS

| | | | | |
|---|---|---|---|---|
| 2,315,720 A | * | 4/1943 | Mallina ................. | H01H 63/02 439/421 |
| 3,675,180 A | * | 7/1972 | Podmore ................ | H01R 4/10 439/877 |
| 4,015,328 A | * | 4/1977 | McDonough ........ | H05K 3/4046 29/830 |
| 4,175,816 A | * | 11/1979 | Burr ........................ | H01R 9/20 439/406 |

(Continued)

FOREIGN PATENT DOCUMENTS

KR    2018-0065674    *  6/2018

OTHER PUBLICATIONS

Extended European Search Report for EP Application No. 21176139.0, dated Nov. 12, 2021, 9 pages.

*Primary Examiner* — Chau N Nguyen
(74) *Attorney, Agent, or Firm* — Billion & Armitage

(57) ABSTRACT

An electrical device includes a flat electrical conductor defining an aperture and an electrically conductive rivet with a body having a layer of a solder composition disposed on a first side and a tubular shaft extending from a second side of the body opposite the first side. A free end of the tubular shaft is flared such that the free end has a diameter larger than a diameter of the aperture.

9 Claims, 7 Drawing Sheets

(56) References Cited

U.S. PATENT DOCUMENTS

| | | | | |
|---|---|---|---|---|
| 4,315,188 A | * | 2/1982 | Cerny | H01R 11/12 |
| | | | | 439/809 |
| 4,576,426 A | * | 3/1986 | Herrmann | H05K 3/326 |
| | | | | 439/423 |
| 4,833,775 A | * | 5/1989 | Nager, Jr. | H05K 3/326 |
| | | | | 29/853 |
| 5,543,601 A | * | 8/1996 | Bartrug | B32B 17/10174 |
| | | | | 338/322 |
| 6,354,868 B1 | | 3/2002 | Korczynski et al. | |
| 6,551,150 B2 | | 4/2003 | Machado | |
| 6,676,455 B2 | | 1/2004 | Machado | |
| 6,780,071 B2 | | 8/2004 | Pereira et al. | |
| 7,125,278 B2 | * | 10/2006 | Maitani | H01R 12/616 |
| | | | | 439/422 |
| 7,192,319 B1 | * | 3/2007 | Rahman | H01H 85/044 |
| | | | | 439/766 |
| 10,840,611 B1 | | 11/2020 | Martins et al. | |
| 2005/0204538 A1 | * | 9/2005 | Dittmann | H01R 43/16 |
| | | | | 29/512 |
| 2017/0033481 A1 | | 2/2017 | Schmalbuch et al. | |

* cited by examiner

SOLDER COATED RIVET ELECTRICAL CONNECTOR

CROSS-REFERENCE TO RELATED APPLICATION

This application claims the benefit of priority to U.S. Provisional Patent Application No. 63/049,910 filed on Jul. 9, 2040, the entire disclosure of which is hereby incorporated by reference.

BACKGROUND

Automotive manufacturers are adopting flat electrical conductors to replace traditional round wire cables to overcome some of the packaging challenges associated with wire cables. However, these flat electrical conductors present some of their own technical challenges, particularly when connecting the flat conductors to conductive pads, e.g., on a glass surface. The thinness of the flat connectors does not provide a strong bond when soldered to a conductive pad and are subject to peeling unless reinforced, e.g., with an epoxy adhesive, which adds additional processing time and material cost. Additionally, the thin flat conductors are a poor dissipator of heat which can cause high mechanical stress levels in the glass as heat is applied during the soldering process which can lead to glass fractures.

SUMMARY

According to one or more aspects of the present disclosure, an electrical device includes a flat electrical conductor defining an aperture and an electrically conductive rivet with a body having a layer of a solder composition disposed on a first side and a tubular shaft extending from a second side of the body opposite the first side. A free end of the tubular shaft is flared such that the free end has a diameter larger than a diameter of the aperture.

In one or more embodiments of the electrical device according to the previous paragraph, the tubular shaft defines a plurality of tubular sections separated by slits extending axially along the tubular shaft.

In one or more embodiments of the electrical device according to any one of the previous paragraphs, the free end of the tubular shaft is flared such that a distance between the free ends of the plurality of tubular sections is increased.

In one or more embodiments of the electrical device according to any one of the previous paragraphs, the body and the tubular shaft are integrally formed from a copper-based alloy and wherein the solder composition is a lead-free solder alloy.

In one or more embodiments of the electrical device according to any one of the previous paragraphs, the lead-free solder alloy contains indium.

In one or more embodiments of the electrical device according to any one of the previous paragraphs, the body defines an annular shape, and the first side of the body is substantially parallel to the second side of the body.

In one or more embodiments of the electrical device according to any one of the previous paragraphs, an outer diameter of the body is greater than an outer diameter of the tubular shaft.

In one or more embodiments of the electrical device according to any one of the previous paragraphs, the electrical device further includes a dielectric housing encasing at least the flared free end of the tubular shaft.

According to one or more aspects of the present disclosure, a method of forming an electrical device includes the steps of providing a planar sheet of an electrically conductive material having a layer of a solder composition covering a first side, forming a planar body by separating the body from the planar sheet, removing a portion of the layer of the solder composition from a section of the first side of the body, and extruding the section to form a tubular shaft extending from a second side of the body opposite the first side.

In one or more embodiments of the method according to the previous paragraph, the body has a diameter that is greater than a diameter of the tubular shaft.

In one or more embodiments of the method according to any one of the previous paragraphs, the body defines an annular shape.

In one or more embodiments of the method according to any one of the previous paragraphs, the planar sheet is formed from a copper-based alloy and the solder composition is a lead-free solder alloy.

In one or more embodiments of the method according to any one of the previous paragraphs, the lead-free solder alloy contains indium.

In one or more embodiments of the method according to any one of the previous paragraphs, the method further includes the steps of providing a flat electrical conductor defining an aperture, inserting the tubular shaft into the aperture, and flaring a free end of the tubular shaft such that the free end has a diameter larger than a diameter of the aperture.

In one or more embodiments of the method according to any one of the previous paragraphs, the method further includes the step of over molding a dielectric housing at least over the free end of the tubular shaft which has been flared, thereby encasing at least the free end of the tubular shaft within the housing.

In one or more embodiments of the method according to any one of the previous paragraphs, the method further includes the step of forming a plurality of slits in the tubular shaft extending axially along the tubular shaft, thereby dividing the tubular shaft into a plurality of tubular sections.

In one or more embodiments of the method according to any one of the previous paragraphs, the method further includes the steps of providing a flat electrical conductor defining an aperture, inserting the tubular shaft into the aperture, and flaring a free end of the tubular shaft such that a distance between the free ends of the plurality of tubular sections is increased.

DETAILED DESCRIPTION

An electrical connector particularly well suited for interconnecting a flat electrical conductor to a conductive pad, e.g., on a glass or polycarbonate sheet, is presented herein. The electrical connector is in the form of a rivet or eyelet and has a body and a tubular shaft extending from the body. One side of the body is coated with a solder composition. The head of the electrical connector may be inserted within an aperture in a flat conductor and then crimped by flaring an end of the head, thereby electrically and mechanically attaching the electrical connector to the flat conductor. The coated side of the body is then placed on the conductive pad and the electrical conductor is heated until the solder reflows, thereby electrically and mechanically attaching the electrical connector to the conductive pad.

Figure 1:
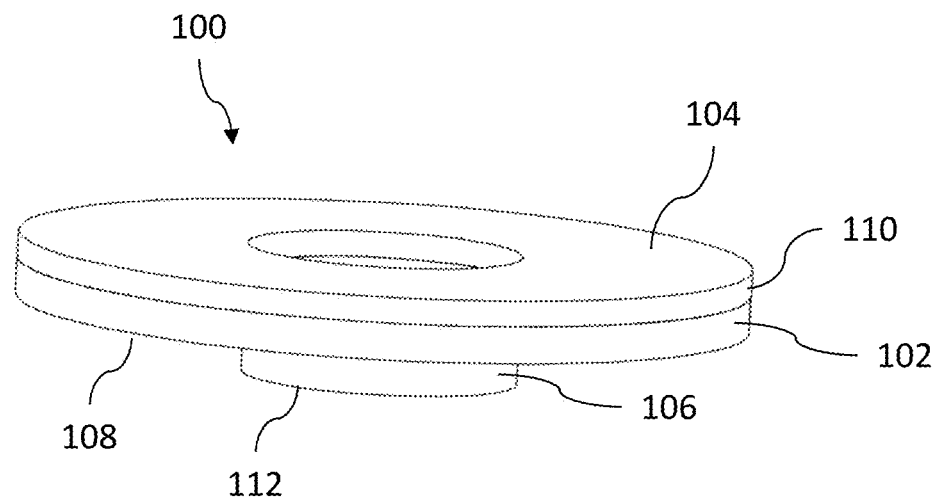
FIG. 1 is a perspective bottom view of a solder coated rivet electrical connector according to some embodiments.
Figure 2:
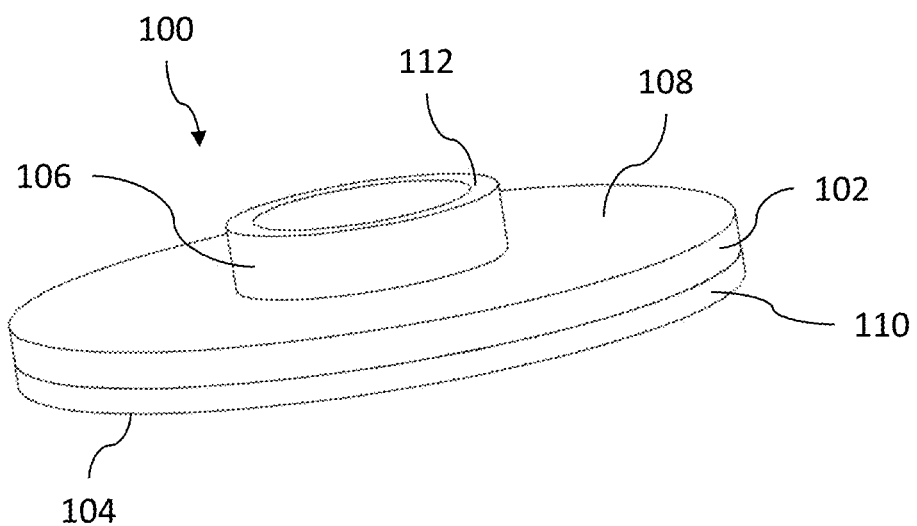
FIG. 2 is a perspective top view of the solder coated rivet electrical connector of FIG. 1 according to some embodiments.

FIGS. 1 and 2 are perspective views of a solder coated rivet electrical connector, hereinafter referred to as the rivet 100, according to some embodiments. The rivet 100 is preferably formed of material with a high electrical conductivity, such as brass or another copper-based alloy. In other embodiments, the rivet 100 may be formed of a nickel-iron alloy. Suitable alloys include an alloy containing 64% iron by weight and 36% nickel by weight, e.g., INVAR®, or an alloy containing 55% iron by weight and 27% nickel by weight, e.g., KOVAR™. Rivets made from these alloys provide the advantages of having a coefficient of thermal expansion similar to glass and being capable of being held in place by an electromagnet during a soldering operation.

The rivet 100 has an annular body 102 having a substantially flat first side 104. As illustrated in FIG. 1, the first side 104 is the bottom side of the body 102. The rivet 100 also includes a tubular shaft 106 which extends from a second side 108 of the body 102 that is located opposite the first side 104. As illustrated in FIG. 1, the tubular shaft 106 extends from the top side of the body 102. In the illustrated example, the tubular shaft 106 is integrally formed with the body 102. The first side 104 is substantially parallel with the second side 108. As used herein, substantially parallel means within one degree of absolutely parallel. A layer of a solder composition 110, 410, such as a lead-free solder alloy containing indium, is coated or clad onto the first side 104 of the body 102.

Figure 3:
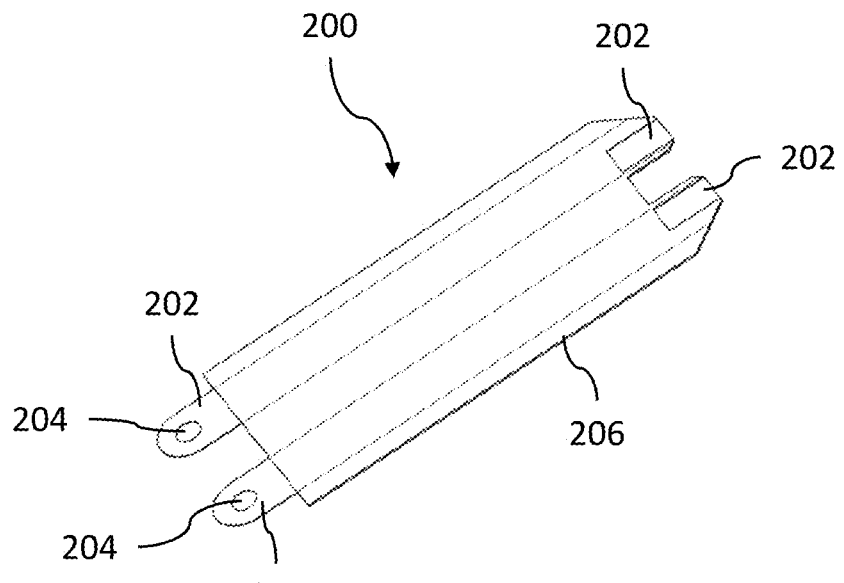
FIG. 3 is a perspective view of a flat electrical conductor according to some embodiments.
Figure 4:
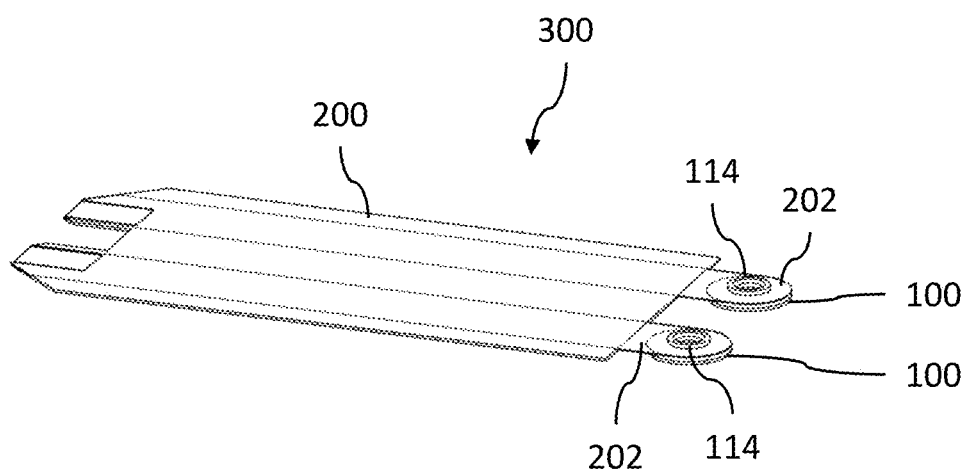
FIG. 4 is a perspective bottom view of an electrical connector assembly including the flat electrical conductor of FIG. 3 and two of the solder coated rivet electrical connectors of FIG. 1 according to some embodiments.
Figure 5:
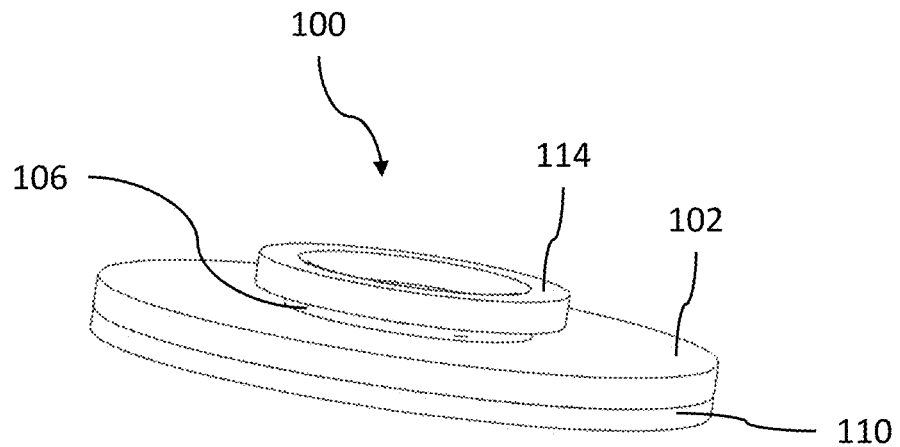
FIG. 5 is an isolated perspective view of the one of the solder coated rivets as formed in the electrical connector assembly of FIG. 4 according to some embodiments.
Figure 6:
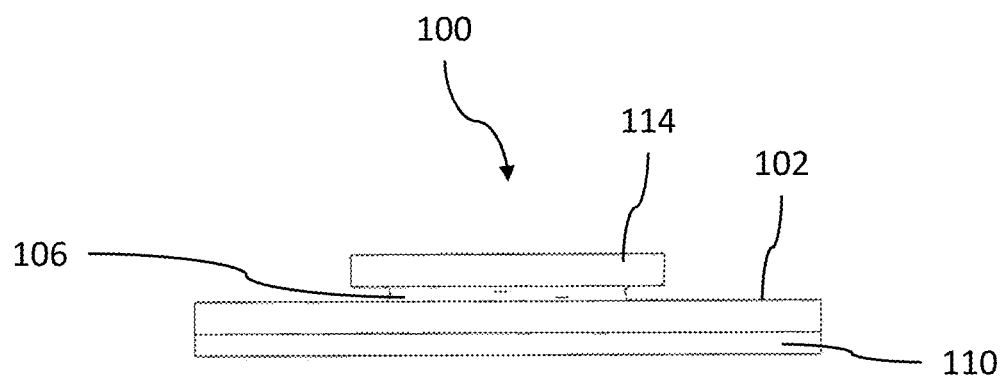
FIG. 6 is an isolated side view of the solder coated rivet of FIG. 5 according to some embodiments.

The rivet 100 may be used to form an electrical connector for a flat electrical connector 200 having at least one flat electrical conductor, hereinafter referred to as the conductor 202 as shown in FIG. 3. The flat conductor 202 defines an aperture 204 near an end of the conductor 202. As shown in FIG. 4, the tubular shaft 106 of the rivet 100 is inserted within the aperture 204 in the conductor 202 and then a free end 112 of the tubular shaft 106 opposite the body 102 is flared 114 or swedged as shown in FIGS. 5 and 6, so that the free end 112 has a diameter larger than the diameter of the aperture 204 in the conductor 202. Preferably the free end 112 is flared so that the flared end 114 is in compressive contact with the conductor 202, thereby mechanically and electrically attaching the rivet 100 to the flat conductor. The rivet is not crimped, i.e., the tubular shaft 106 is not flattened or deformed, until after the tubular shaft 106 is inserted within the aperture 204 in the conductor 202. A portion of the conductor 202 is covered by an electrical insulative material 206, such as a 4,4'-oxydiphenylene-pyromellitimide material, e.g., KAPTON® tape.

After the rivet 100 is attached to the conductor 202 to form an electrical connector assembly 300 as illustrated in FIG. 4, the conductor 202 may be attached to a conductive pad (not shown) on a glass, laminated glass, or polycarbonate sheet (not shown) by placing the first side 104 of the rivet 100 in contact with the conductive pad and heating the rivet 100 to reflow the solder on the first side 104, thereby providing a means for mechanically and electrically attaching the rivet 100 to the conductive pad.

Figure 7:
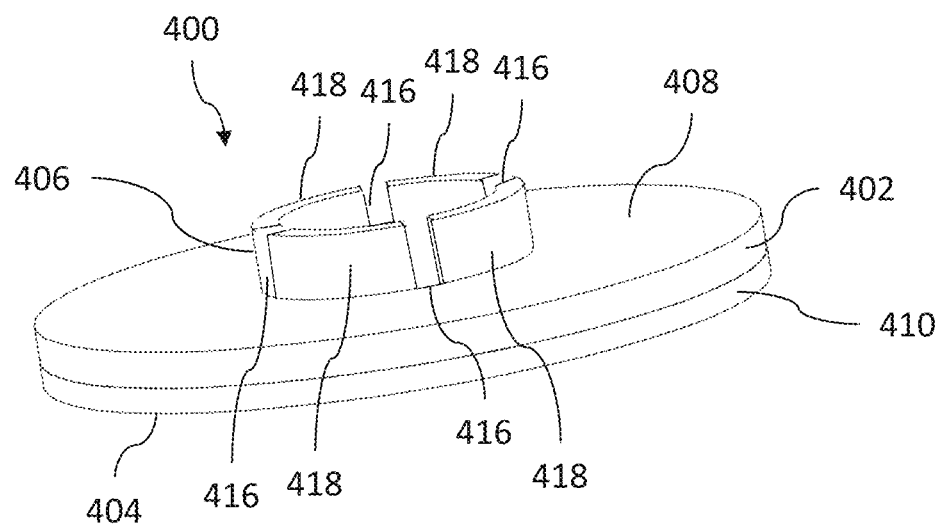
FIG. 7 is a perspective top view of a solder coated rivet electrical connector according to some embodiments.

An alternative embodiment of a rivet 400 is shown in FIG. 7. The rivet 400 is preferably formed of material with a high electrical conductivity, such as brass or another copper-based alloy. In other embodiments, the rivet 400 may be formed of a nickel-iron alloy. Suitable alloys include an alloy containing 64% iron by weight and 36% nickel by weight, e.g., INVAR®, or an alloy containing 55% iron by weight and 27% nickel by weight, e.g., KOVAR™. Rivets made from these alloys provide the advantages of having a coefficient of thermal expansion similar to glass and being capable of being held in place by an electromagnet during a soldering operation.

The rivet 400 has an annular body 402 having a substantially flat first side 404. As illustrated in FIG. 7, the first side 404 is the bottom side of the body 402. The rivet 400 also includes a tubular shaft 406 which extends from a second side 408 of the body 402 that is located opposite the first side 404. As illustrated in FIG. 7, the tubular shaft 106 extends from the top side of the body 102. In the illustrated example, the tubular shaft 406 is integrally formed with the body 402 and defines a plurality of axial slits 416 that form a plurality of tubular sections 418. The first side 404 is substantially parallel with the second side 408. As used herein, substantially parallel means within one degree of absolutely parallel. A layer of a solder composition 410, such as a lead-free solder alloy containing indium, is coated or clad onto the first side 404 of the body 402.

Figure 8:
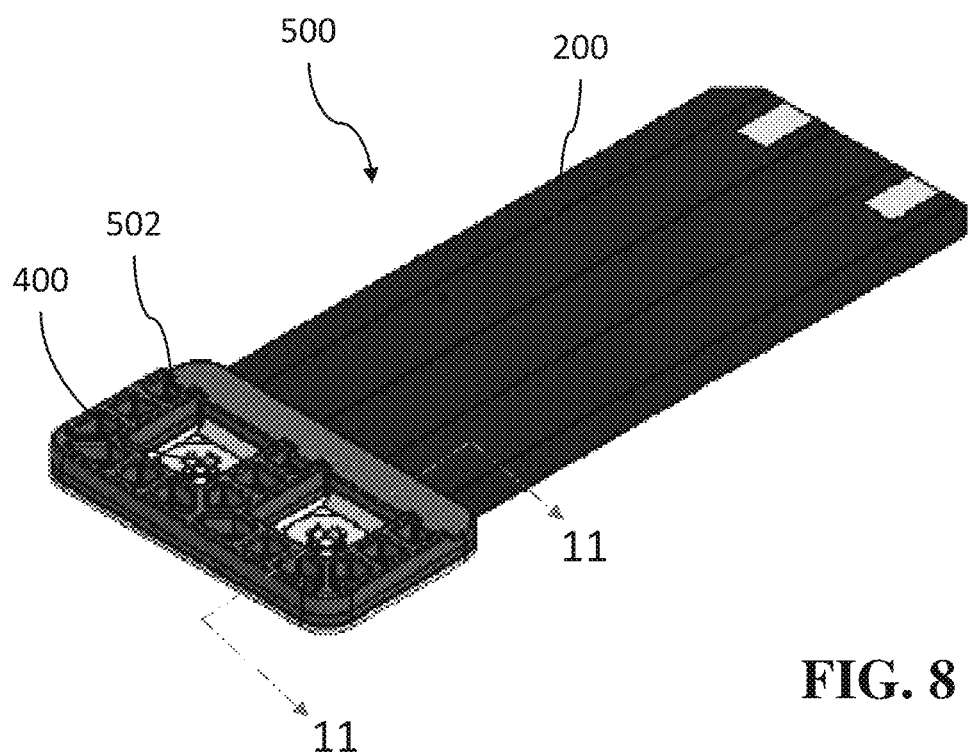
FIG. 8 is a perspective bottom view of an electrical connector assembly of the flat electrical conductor of FIG. 3, two solder coated rivets of FIG. 7, and an over molded housing according to some embodiments.
Figure 9:
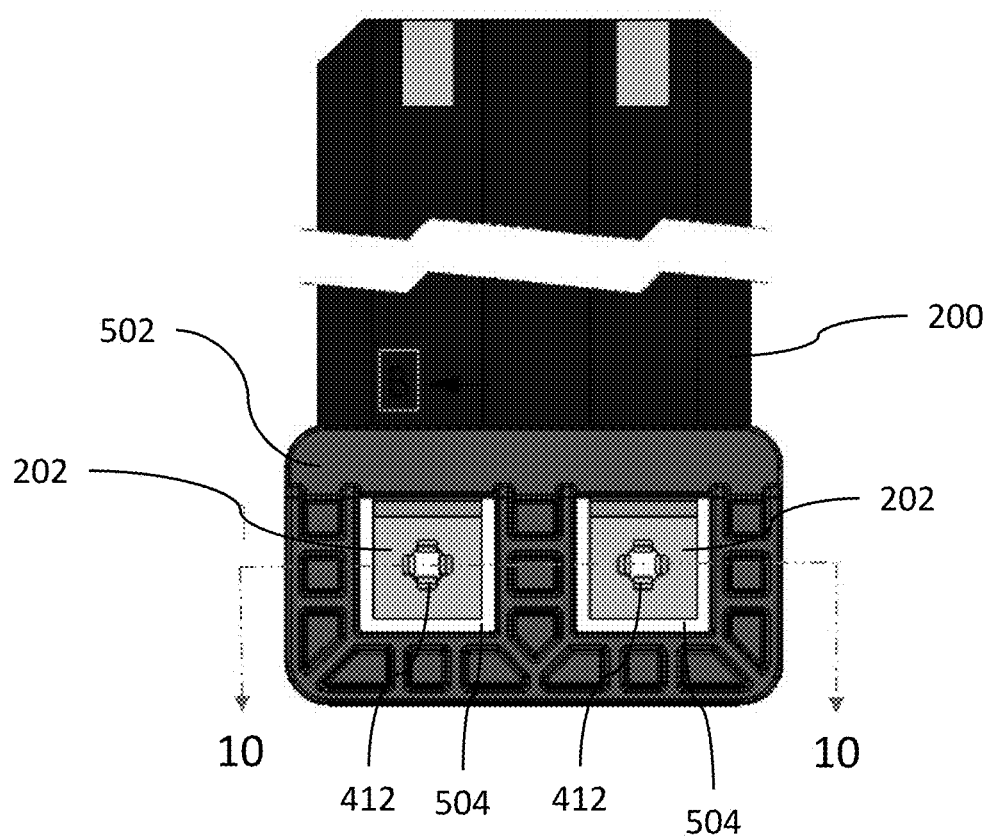
FIG. 9 is a bottom plan view of an electrical connector assembly of FIG. 8 according to some embodiments.

The rivet 400 may be used to form an electrical connector assembly 500 by attaching the rivet 400 to the conductor 202 as shown in FIG. 3. The conductor 202 defines an aperture 204 near an end of the conductor 202. As shown in FIG. 8, the tubular shaft 606 of the rivet 400 is inserted within the aperture 204 in the conductor 202 and then free ends 412 of the tubular sections 418 have flared 414 or swedged sections as shown in FIGS. 8-11, so that a distance between the free ends 412 of the plurality of tubular sections 418 is increased, thereby mechanically and electrically attaching the rivet 400 to the conductor 202. The rivet 400 is not crimped, i.e., the tubular sections 418 are not flattened or deformed, until after the tubular shaft 406 is inserted within the aperture 204 in the conductor 202. A portion of the conductor 202 is covered by an electrical insulative material 206, such as a 4,4-oxydiphenylene-pyromellitimide material, e.g., KAPTON® tape.

Figure 10:
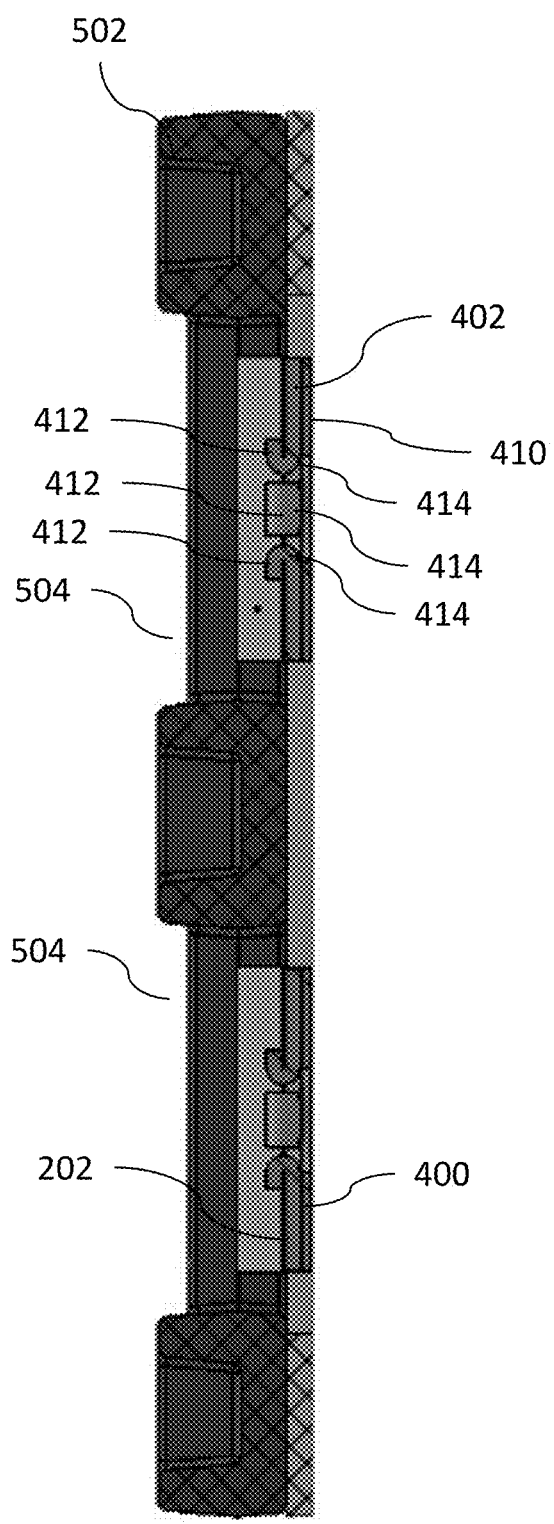
FIG. 10 is a cross section end view of an electrical connector assembly of FIG. 8 along the section line 10-10 of FIG. 9 according to some embodiments.
Figure 11:
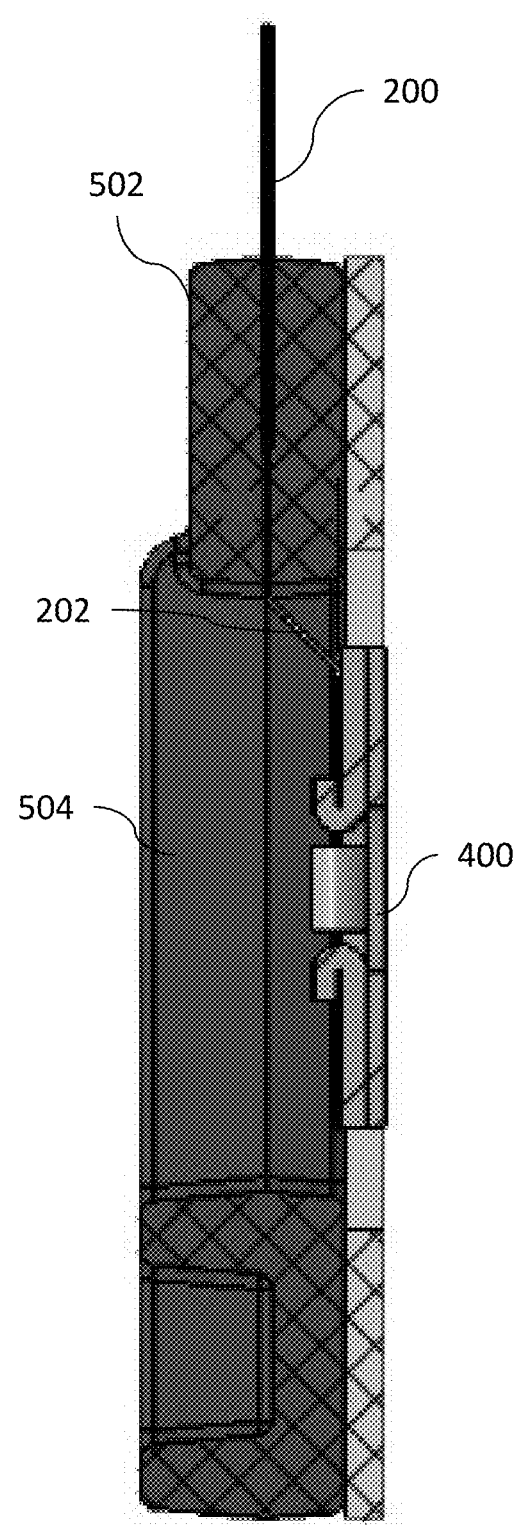
FIG. 11 is a partial cross section side view of an electrical connector assembly of FIG. 8 along the section line 11-11 of FIG. 8 according to some embodiments.

The electrical connector assembly 500 also includes a housing 502 formed of a moldable insulative material, such as polybutylene terephthalate (PBT), acrylonitrile butadiene styrene (ABS) or polyamide (NYLON) polymers, These polymers may or may not be glass filled. The housing is over molded around the apertures 204 in the conductors 202. As best shown in FIGS. 10 and 11, the housing 502 defines an opening 504 extending through the housing 502 and located around the apertures 204 to allow access to the apertures 204 for inserting the rivet 400 into the apertures 204 and flaring 414 the tubular sections 418.

Alternative embodiments may be envisioned in which the rivets 100 are used with the housing 502 or the rivets 400 are used without the housing 502.

Figure 12:
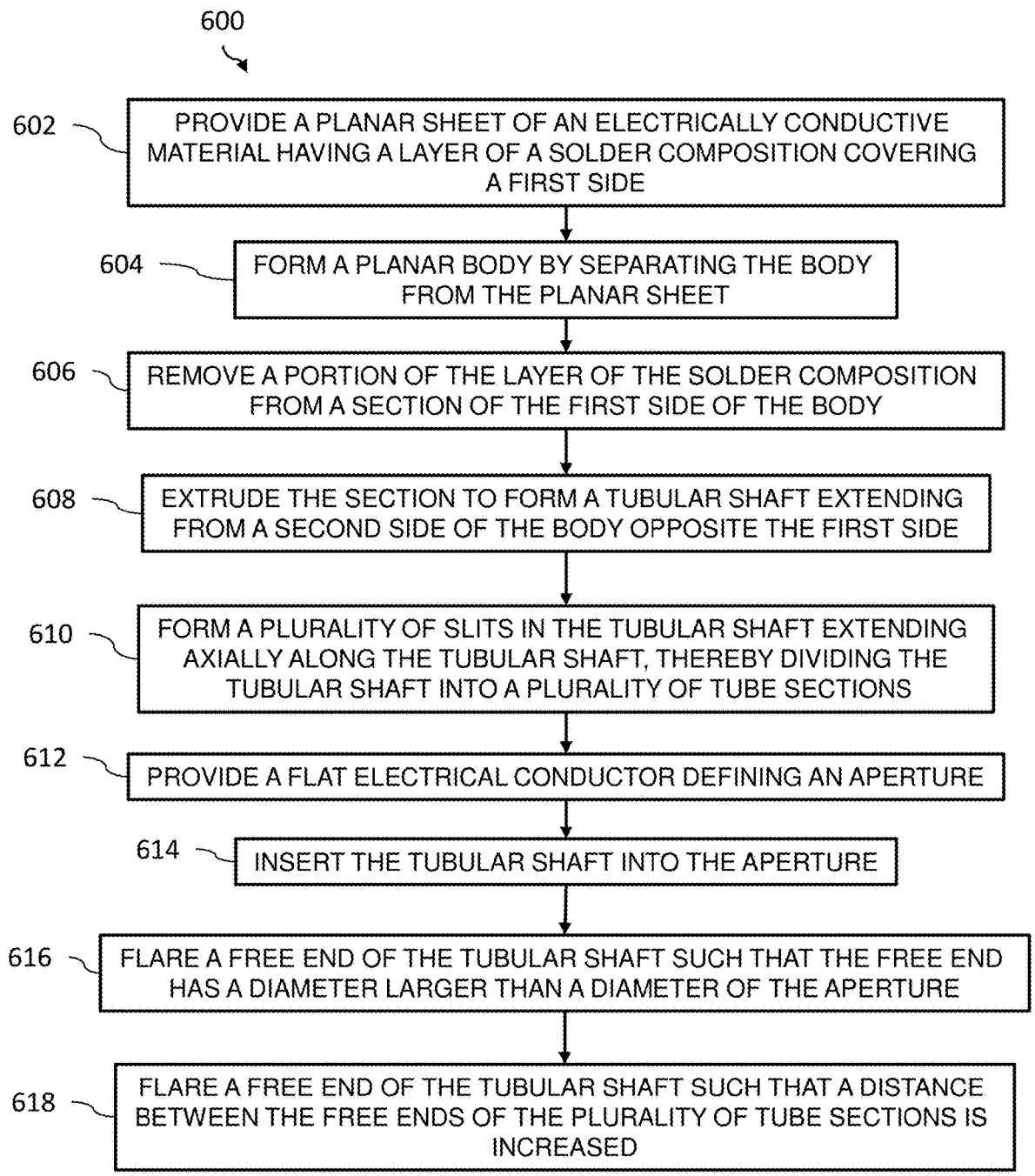
FIG. 12 is a flow chart of a method of forming a solder coated rivet electrical connector.

FIG. 12 illustrates a method 600 of forming a solder coated rivet electrical connector, such as the rivet 100 described above. The method contains the following steps:

STEP 602, PROVIDE A PLANAR SHEET OF AN ELECTRICALLY CONDUCTIVE MATERIAL HAVING A LAYER OF A SOLDER COMPOSITION COVERING A FIRST SIDE, includes providing a planar sheet of an electrically conductive material, such as brass, another copper-based alloy, or a nickel-iron alloy, when the planar sheet has a layer of a solder composition covering a first side, such as a lead-free solder alloy containing indium which is coated or clad onto one side of the planar sheet;

STEP 604, FORM A PLANAR BODY BY SEPARATING THE BODY FROM THE PLANAR SHEET, includes forming a planar body 102, 402 by separating the body 102, 402 from the planar sheet, for example by using a cutting, stamping, or blanking operation;

STEP 606, REMOVE A PORTION OF THE LAYER OF THE SOLDER COMPOSITION FROM A SECTION OF THE FIRST SIDE OF THE BODY, includes removing a portion of the layer of the solder composition 110, 410 from a section of the first side 104, 404 of the body 102, 402, for example by using a heated vacuum solder removal tool. The section from which the layer of the solder composition 110, 410 is removed preferably has a generally circular shape;

STEP 608, EXTRUDE THE SECTION TO FORM A TUBULAR SHAFT EXTENDING FROM A SECOND SIDE OF THE BODY OPPOSITE THE FIRST SIDE, includes extruding the section from which the layer of the solder composition 110, 410 is removed to form a tubular shaft 106, 406 that extends from a second side 108, 408 of the body 102, 402 that is arranged opposite the first side 104,404. The body 102, 402 has a diameter that is greater than a diameter of the tubular shaft 106, 406;

STEP 610, FORM A PLURALITY OF SLITS IN THE TUBULAR SHAFT EXTENDING AXIALLY ALONG THE TUBULAR SHAFT, THEREBY DIVIDING THE TUBULAR SHAFT INTO A PLURALITY OF TUBULAR SECTIONS, is an optional step including forming a plurality of slits 416 in the tubular shaft 406 extending axially along the tubular shaft 406, thereby dividing the tubular shaft 406 into a plurality of tubular sections 418;

STEP 612, PROVIDE A FLAT ELECTRICAL CONDUCTOR DEFINING AN APERTURE, is an optional step that includes providing a flat electrical conductor 202 defining an aperture 204;

STEP 614, INSERT THE TUBULAR SHAFT INTO THE APERTURE, is an optional step that includes inserting the tubular shaft 106, 406 into the aperture 204;

STEP 616, FLARE A FREE END OF THE TUBULAR SHAFT SUCH THAT THE FREE END HAS A DIAMETER LARGER THAN A DIAMETER OF THE APERTURE, is an optional step that includes flaring 114 a free end 112 of the tubular shaft 106 such that the free end 112 has a diameter larger than a diameter of the aperture 204; and STEP 618, FLARE A FREE END OF THE TUBULAR SHAFT SUCH THAT A DISTANCE BETWEEN THE FREE ENDS OF THE PLURALITY OF TUBULAR SECTIONS IS INCREASED, is an optional step that includes flaring 414 a free end 412 of the tubular shaft 406 such that a distance between the free ends 412 of the plurality of tubular sections 418 is increased.

The rivet 100, 400 provides the advantages of having a thermal mass that more gradually transfers heat to a conductive pad on a glass surface which reduces the likelihood of cracking the glass compared to directly soldering a flat conductor to a conductive pad on a glass surface. The rivet 100, 400 also provides a larger surface area compared to directly soldering a flat conductor to a conductive pad on a glass surface which reduces localized heating of the glass, again thereby reducing the likelihood of cracking the glass. The rivet 100, 400 provides a strong bond between the conductor 202 and the conductive pad which is less prone to peeling. In addition, the flared tubular sections 418 of rivet 400 have sharp corners that "bite" into the conductor 202 to provide a better electrical and mechanical connection between the rivet 400 and the conductor 202.

While the invention has been described with reference to an exemplary embodiment(s), it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention is not limited to the particular embodiment(s) disclosed, but that the invention will include all embodiments falling within the scope of the appended claims.

The invention claimed is:

1. An electrical device, comprising:
a flat electrical conductor defining an aperture; and
an electrically conductive rivet with an annular planar body having a layer of a solder composition disposed on a first side and a tubular shaft extending from a second side of the body opposite the first side, wherein the tubular shaft defines a plurality of tubular sections separated by slits axially extending from the body to free ends of the plurality of tubular sections and wherein the free ends of the plurality of tubular sections are flared such that a distance between the free ends of the plurality of tubular sections is greater than a diameter of the aperture, and wherein the free ends of the plurality of tubular sections engage the electrical conductor to provide an electrical and mechanical connection between the electrically conductive rivet and the electrical conductor, wherein the body and the tubular shaft are integrally formed from a copper-based alloy and wherein the solder composition is a lead-free solder alloy.

2. The electrical device according to claim 1, wherein the lead-free solder alloy contains indium.

3. The electrical device according to claim 1, wherein the first side of the body is substantially parallel to the second side of the body.

4. The electrical device according to claim 3, wherein an outer diameter of the body is greater than an outer diameter of the tubular shaft.

5. The electrical device according to claim 1, wherein the flared tubular sections have sharp corners that engage the electrical conductor to provide an enhanced electrical and mechanical connection between the electrically conductive rivet and the electrical conductor.

6. An electrical device, comprising:
   a flat electrical conductor defining an aperture; and
   an electrically conductive rivet with an annular planar body having a layer of a solder composition disposed on a first side and a tubular shaft extending from a second side of the body opposite the first side, wherein the tubular shaft defines a plurality of tubular sections separated by slits axially extending from the body to free ends of the plurality of tubular sections and wherein the free ends of the plurality of tubular sections are flared such that a distance between the free ends of the plurality of tubular sections is greater than a diameter of the aperture, and wherein the free ends of the plurality of tubular sections engage the electrical conductor to provide an electrical and mechanical connection between the electrically conductive rivet and the electrical conductor; and
   a dielectric housing encasing at least the flared free ends of the tubular shaft.

7. The electrical device according to claim 6, wherein the solder composition comprises indium.

8. The electrical device according to claim 6, wherein the first side of the body is substantially parallel to the second side of the body.

9. The electrical device according to claim 8, wherein an outer diameter of the body is greater than an outer diameter of the tubular shaft.

* * * * *